(12) United States Patent
Tian et al.

(10) Patent No.: US 11,296,122 B2
(45) Date of Patent: Apr. 5, 2022

(54) ARRAY SUBSTRATE, METHOD FOR FABRICATING THE SAME AND DISPLAY PANEL

(71) Applicant: BOE TECHNOLOGY GROUP CO., LTD., Beijing (CN)

(72) Inventors: Hongwei Tian, Beijing (CN); Yanan Niu, Beijing (CN); Meng Zhao, Beijing (CN); Lei Wang, Beijing (CN); Zheng Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/641,372

(22) PCT Filed: May 23, 2019

(86) PCT No.: PCT/CN2019/088100
§ 371 (c)(1),
(2) Date: Feb. 24, 2020

(87) PCT Pub. No.: WO2019/223755
PCT Pub. Date: Nov. 28, 2019

(65) Prior Publication Data
US 2021/0375952 A1 Dec. 2, 2021

(30) Foreign Application Priority Data
May 24, 2018 (CN) .......................... 201810508747.6

(51) Int. Cl.
*H01L 27/12* (2006.01)
(52) U.S. Cl.
CPC ...... *H01L 27/1237* (2013.01); *H01L 27/1222* (2013.01); *H01L 27/1248* (2013.01); *H01L 27/1262* (2013.01)

(58) Field of Classification Search
CPC ............. H01L 27/1237; H01L 27/1222; H01L 27/1248; H01L 27/1262
See application file for complete search history.

(56) References Cited

U.S. PATENT DOCUMENTS

2004/0016924 A1   1/2004   Yamada et al.
2014/0071514 A1   3/2014   Zhang et al.
(Continued)

FOREIGN PATENT DOCUMENTS

CN         1445862 A       10/2003
CN       103022147 A        4/2013
(Continued)

OTHER PUBLICATIONS

Chinese Office Action corresponding to CN 201810508747.6; dated May 20, 2020 (15 pages, including English translation).

*Primary Examiner* — Mohammed R Alam
(74) *Attorney, Agent, or Firm* — Myers Bigel, P.A.

(57) ABSTRACT

Embodiments of the present disclosure provide an array substrate including a base substrate, an active layer on the base substrate, a first gate insulating layer on the active layer, a first gate on the first gate insulating layer, and a second gate insulating layer on the first gate. The second gate insulating layer includes a first sub-insulating layer and a second sub-insulating layer disposed in a direction away from the active layer, and a hydrogen content of the first sub-insulating layer is larger than a hydrogen content of the second sub-insulating layer. A method for fabricating the array substrate and a display panel including the array substrate are also provided.

19 Claims, 8 Drawing Sheets

(56) References Cited

U.S. PATENT DOCUMENTS

| | | | |
|---|---|---|---|
| 2016/0133755 A1 | 5/2016 | Tian | |
| 2018/0012947 A1* | 1/2018 | Lee | ............... H01L 27/1225 |
| 2018/0069033 A1 | 3/2018 | Chen | |
| 2018/0277376 A1* | 9/2018 | Wang | ............... H01L 28/60 |
| 2019/0140195 A1 | 5/2019 | Zhao et al. | |

FOREIGN PATENT DOCUMENTS

| | | |
|---|---|---|
| CN | 103985637 A | 8/2014 |
| CN | 105655353 A | 6/2016 |
| CN | 106783628 A | 5/2017 |
| CN | 107068771 A | 8/2017 |
| CN | 107819021 A | 3/2018 |
| CN | 108598093 A | 9/2018 |
| EP | 2784575 A1 | 10/2014 |

\* cited by examiner

ARRAY SUBSTRATE, METHOD FOR FABRICATING THE SAME AND DISPLAY PANEL

RELATED APPLICATIONS

This application is a 35 U.S.C. 371 national stage application of a PCT International Application No. PCT/CN2019/088100, filed on May 23, 2019, which claims priority from Chinese Patent Application No. 201810508747.6, filed on May 24, 2018, the entire disclosures of which are incorporated herein by reference.

TECHNICAL FIELD

The present disclosure relates to the field of display technologies, and in particular, to a method for fabricating an array substrate, an array substrate, and a display panel.

BACKGROUND

The display panel generally includes an array substrate and various display structures provided on the array substrate. The flexible display panel is a current development trend, but various inorganic films in the array substrate have limited the flexibility of the display panel due to their own materials.

SUMMARY

According to one aspect of the disclosure, an array substrate is provided. The array substrate comprises: a base substrate; an active layer on the base substrate; a first gate insulating layer on the active layer; a first gate on the first gate insulating layer; and a second gate insulating layer on the first gate, wherein the second gate insulating layer comprises a first sub-insulating layer and a second sub-insulating layer disposed in a direction away from the active layer, and a hydrogen content of the first sub-insulating layer is larger than a hydrogen content of the second sub-insulating layer.

In some embodiments, a density of the first sub-insulating layer is smaller than a density of the second sub-insulating layer.

In some embodiments, a hydrogen content of the first sub-insulating layer decreases in a direction away from the active layer, and the hydrogen content of the first sub-insulating layer at the surface facing the second sub-insulating layer is larger than the hydrogen content of the second sub-insulating layer at the surface facing the first sub-insulating layer.

In some embodiments, a hydrogen content of the second sub-insulating layer decreases in a direction away from the active layer, and the hydrogen content of the first sub-insulating layer at the surface facing the second sub-insulating layer is larger than the hydrogen content of the second sub-insulating layer at the surface facing the first sub-insulating layer.

In some embodiments, a hydrogen content of at least one of the first sub-insulating layer and the second sub-insulating layer is constant in a direction away from the active layer.

In some embodiments, a hydrogen content of the first sub-insulating layer is about 30% to 45%.

In some embodiments, the above array substrate further comprises a groove penetrating through the second gate insulating layer and extending into the first gate insulating layer, the orthographic projection of the groove on the base substrate is around the orthographic projection of the active layer on the base substrate.

In some embodiments, the second gate insulating layer comprises a first region and a second region, the thickness of the first region is larger than the thickness of the second region, the active layer is in an orthographic projection of the first region on the base substrate, and the second region is a region of the second gate insulating layer other than the first region.

In some embodiments, the above array substrate further comprises: a second gate on the second gate insulating layer; and a source-drain via penetrating through the second gate insulating layer and the first gate insulating layer, and the active layer is exposed through the source-drain via.

In some embodiments, the above array substrate further comprises: an inter-layer dielectric layer on the second gate.

In some embodiments, the array substrate comprises a plurality of sub-pixels arranged in a matrix, and the second gate insulating layer further comprises a trench provided between each of the sub-pixels.

According to another aspect of the disclosure, a display panel comprising any of the above array substrates is provided.

According to yet another aspect of the disclosure, a method for fabricating an array substrate is provided. The method comprises: forming an active layer, a first gate insulating layer, and a first gate in this order on a base substrate; forming a second gate insulating layer on the base substrate on which the first gate is formed, the second gate insulating layer comprising a first sub-insulating layer and a second sub-insulating layer disposed in a direction away from the active layer, wherein a hydrogen content of the first sub-insulating layer is larger than a hydrogen content of the second sub-insulating layer; and hydrogenating the active layer.

In some embodiments, said forming a second gate insulating layer on the base substrate on which the first gate is formed, comprises: depositing and forming the first sub-insulating layer on the base substrate on which the first gate is formed at a first deposition rate; and depositing and forming the second sub-insulating layer on the base substrate on which the first sub-insulating layer is formed at a second deposition rate, wherein, the second deposition rate is less than the first deposition rate.

In some embodiments, before hydrogenating the active layer, the method further comprises: forming a second gate on the base substrate on which the second gate insulating layer is formed; forming a source-drain via on the base substrate on which the second gate is formed, and the active layer is exposed through the source-drain via.

In some embodiments, before hydrogenating the active layer, the method further comprises: forming a groove on the base substrate on which the second gate insulating layer is formed, a bottom of the groove is in the first gate insulating layer, and an orthographic projection of the groove on the base substrate is around the orthographic projection of the active layer on the base substrate. Said hydrogenating the active layer comprises: disposing the base substrate on which the groove is formed in a hydrogen atmosphere, to hydrogenate the active layer.

In some embodiments, before hydrogenating the active layer, the method further comprises: forming a second gate on the base substrate on which the second gate insulating layer is formed; coating a silicon-based organic material layer on the base substrate on which the second gate is formed; baking the silicon-based organic material layer; and processing the silicon-based organic material layer into an inter-layer dielectric layer.

In some embodiments, said forming the second gate insulating layer on the base substrate on which the first gate is formed, comprises: forming the second gate insulating layer on the base substrate on which the first gate is formed by a gray mask process. The second gate insulating layer comprises a first region and a second region, the thickness of the first region is larger than the thickness of the second region, the active layer is in an orthographic projection of the first region on the base substrate, and the second region is a region of the second gate insulating layer other than the first region.

In some embodiments, the array substrate comprises a plurality of sub-pixels arranged in a matrix, and the method further comprises: forming a trench between each of the sub-pixels in the second gate insulating layer.

In some embodiments, the active layer comprises one or more of low temperature polysilicon and microcrystalline silicon.

BRIEF DESCRIPTION OF THE DRAWINGS

In order to more clearly illustrate the technical solutions in the embodiments of the present disclosure, the drawings used in the description of the embodiments will be briefly introduced below. Obviously, the drawings in the following description are only some embodiments of the present disclosure. For those of ordinary skill in the art, other drawings may be obtained according to these drawings without paying creative labor.

Figure 1:
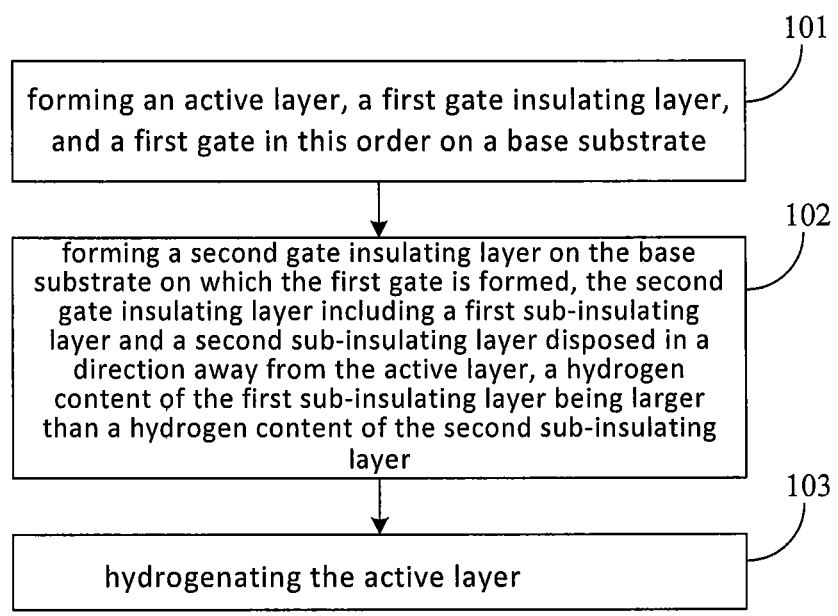
FIG. 1 is a flowchart of a method for fabricating an array substrate according to an embodiment of the present disclosure.

Through the above drawings, specific embodiments of the present disclosure have been shown, which will be described in more detail later. These drawings and text descriptions are not intended to limit the scope of the concept of the present disclosure in any way, but to explain the concepts of the present disclosure to those skilled in the art by referring to specific embodiments.

DETAILED DESCRIPTION OF EMBODIMENTS

To make the objectives, technical solutions, and advantages of the present disclosure clearer, the embodiments of the present disclosure will be described in further detail below with reference to the accompanying drawings.

With the development of flexible display panels, the requirements for display panels have gradually changed from bendable and foldable to stretchable. In an array substrate of a current flexible display panel, there are multilayer inorganic films. When the display panel undergoes severe deformation, the inorganic film in the array substrate is more prone to the phenomenon of collision and separation, etc., which may cause the inorganic film to have minor damages during the collision and separation, and the minor damages may develop into larger cracks and affect the normal operation of the display panel. Therefore, it is proposed to use an organic film to replace the existing inorganic film layer.

A typical method for fabricating a flexible array substrate may include the following steps: forming an active layer made of low temperature Poly-silicon (LTPS), a first gate insulating layer, a first gate, a second gate insulating layer and a second gate in this order on a base substrate; hydrogenating the active layer in the base substrate on which the second gate is formed by a solid-state diffusion method to improve the electrical performance of the active layer; forming an inter-layer dielectric (ILD) layer made of an organic material on the base substrate on which the second gate is formed to improve the flexibility of the array substrate. Because organic materials are less tolerant to high temperatures than inorganic materials, the active layer needs to be hydrogenated before ILD is formed to avoid damage to the ILD.

Hydrogenation process may fill the unbonded or unsaturated bonds of the silicon atoms in the LTPS (or microcrystalline silicon) constituting the active layer with hydrogen atoms, thereby improving the electrical performance of the LTPS (or microcrystalline silicon). However, the temperature required for effective hydrogenation of the active layer is usually higher than the temperature tolerance of the organic film, so that the organic film will limit the hydrogenation of the active layer. It has been proposed to hydrogenate the active layer before forming the ILD. However, in such a solution, since the hydrogen content in the film layers on the base substrate is less when no ILD is formed, and there is no film layer to prevent hydrogen from overflowing from the base substrate, the hydrogenation ability of the film layers on the base substrate to the active layer is insufficient, which may cause a reduction in the electrical performance of the active layer.

In view of this, embodiments of the present disclosure provide an improved method for fabricating an array substrate, an array substrate, and a display panel.

FIG. 1 is a flowchart of a method for fabricating an array substrate according to an embodiment of the present disclosure.

As shown in FIG. 1, at step 101, an active layer, a first gate insulating layer, and a first gate are formed in this order on a base substrate, wherein the active layer includes LTPS.

Then, in step 102, a second gate insulating layer is formed on the base substrate on which the first gate is formed, and the second gate insulating layer includes a first sub-insulating layer and a second sub-insulating layer disposed in a direction away from the active layer, wherein a hydrogen content of the first sub-insulating layer is larger than a hydrogen content of the second sub-insulating layer.

Next, in step 103, the active layer is hydrogenated.

In the above-mentioned method for fabricating an array substrate provided by the embodiment of the present disclosure, by forming a second gate insulating layer including a first sub-insulating layer with a larger hydrogen content and a second sub-insulating layer with a smaller hydrogen content, in the process of hydrogenation, the first sub-insulating layer may serve as a hydrogen source, and the second sub-insulating layer may serve as a hydrogen barrier layer, so that hydrogen may diffuse to the direction of the active layer better, thereby increasing the distribution of hydrogen concentration gradient toward the active layer to improve the hydrogenation of the active layer, thereby avoiding insufficient hydrogenation of the active layer, which causes problems that affect the electrical performance of the active layer, and achieving the effect of improving the electrical performance of the active layer.

Figure 2:
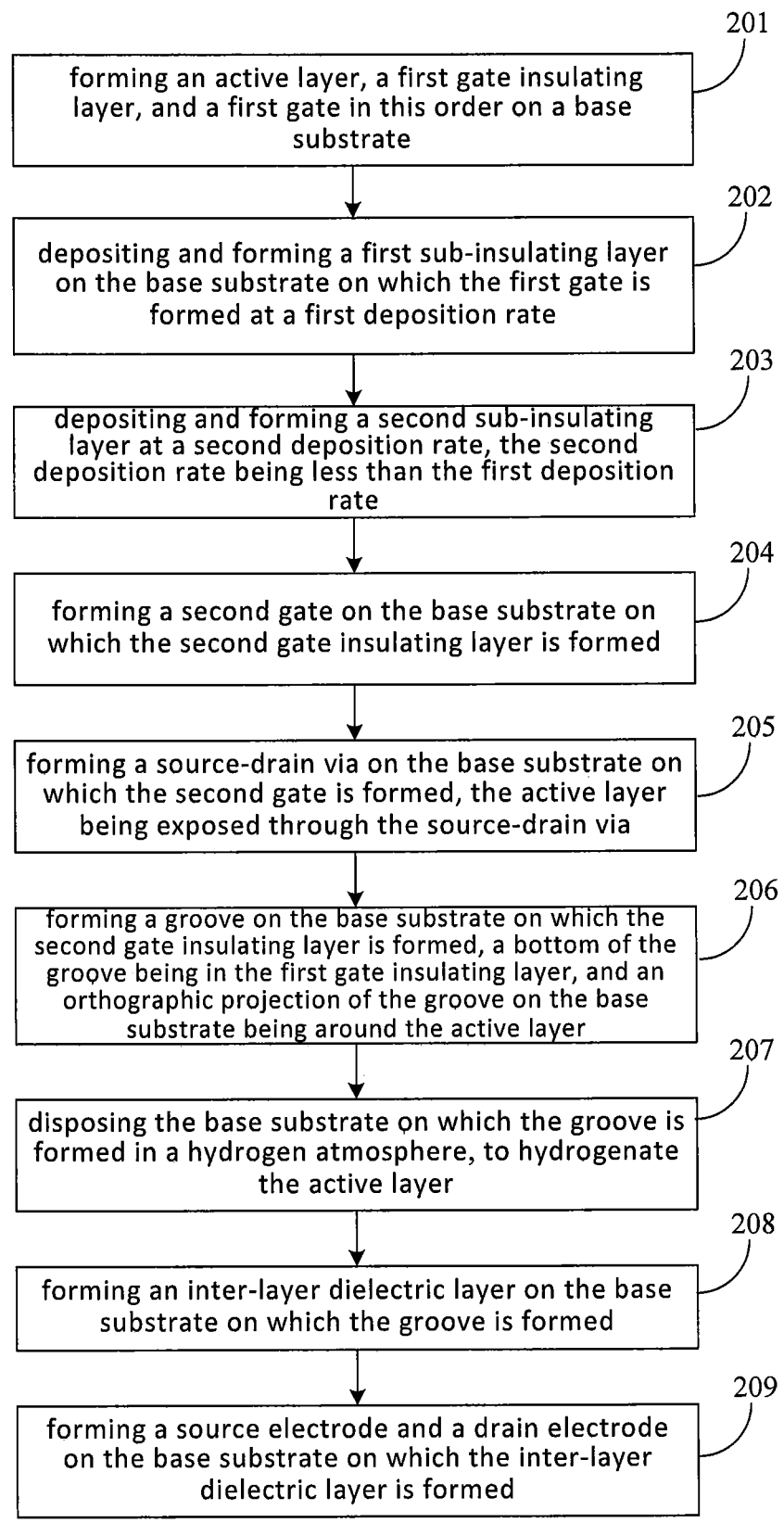
FIG. 2 is a flowchart of another method for fabricating an array substrate according to an embodiment of the present disclosure.

FIG. 2 is a flowchart of another method for fabricating an array substrate according to an embodiment of the present disclosure.

As shown in FIG. 2, at step 201, an active layer, a first gate insulating layer, and a first gate are formed in this order on a base substrate, where the active layer includes LTPS and/or microcrystalline silicon. LTPS or microcrystalline silicon has a higher electron mobility, so an active layer including LTPS or microcrystalline silicon may improve the response speed of a thin film transistor (TFT).

Figure 3:
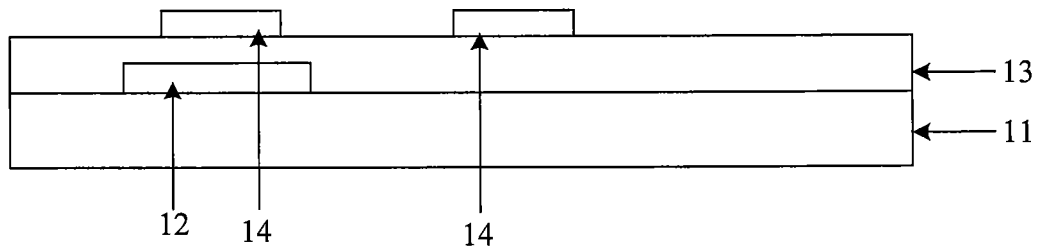
FIG. 3 is a schematic structural diagram of a substrate in the fabricating method shown in FIG. 2.

When step 201 is completed, the structure of the base substrate may be as shown in FIG. 3. The base substrate 11 is provided with an active layer 12, a first gate insulating layer 13, and a first gate 14 in this order. The material of the first gate insulating layer 13 may include materials such as silicon nitride. The first gate 14 may include a metal or other conductive material, which is not limited in the embodiment of the present disclosure.

In an exemplary embodiment, the active layer is composed of LTPS, and the process of forming the active layer composed of LTPS may include the following steps:

First, amorphous silicon (a-si) is dehydrogenated. When the content of hydrogen in the amorphous silicon is excessive, the quality of the polysilicon formed from the amorphous silicon may decrease. Therefore, dehydrogenation treatment may be performed on the amorphous silicon first. Optionally, the hydrogen content in the amorphous silicon may be made less than 2% by dehydrogenation.

An amorphous silicon layer is then formed on the base substrate by amorphous silicon. After that, the amorphous silicon layer is annealed at a low temperature to be transformed into a polysilicon layer. Specifically, the low-temperature annealing process may be performed by a laser annealing technique. Finally, the polysilicon layer is patterned through a patterning process to form an active layer. The active layer may include an active layer pattern in a plurality of TFTs on the base substrate. Typically, the patterning process may include steps of coating the photoresist, exposing the photoresist, developing the photoresist, etching, and stripping the photoresist, etc.

As known to those skilled in the art, for a process of forming an active layer composed of microcrystalline silicon, reference may be made to the process of forming an active layer composed of LTPS described above and related technologies, and details are not described herein.

Optionally, the base substrate may be a flexible base substrate, and the base substrate may be composed of a polyimide substrate or a composite film layer including a polyimide substrate. For example, the base substrate may include polyimide and a spacer layer, a polyimide substrate, and a buffer layer disposed on the polyimide in this order.

Returning to FIG. 2, at step 202, a first sub-insulating layer is deposited and formed on the base substrate on which the first gate is formed at a first deposition rate, and the hydrogen content of the first sub-insulating layer is increased. In particular, the first deposition rate may be a speed at which a conventional second gate insulating layer is formed in the related art.

Optionally, the first sub-insulating layer may be formed by a Chemical Vapor Deposition (CVD) technology, and the hydrogen content of the first sub-insulating layer may be increased by increasing the flow of the reaction gas containing hydrogen. For example, if the first sub-insulating layer is made of silicon nitride, the reaction gas may include ammonia gas (chemical formula: $NH_3$) and silane (chemical formula: $SiH_4$). Correspondingly, the flow rate of $NH_3$ may be increased to 1.1 times to 1.5 times the normal level to increase the hydrogen content of the first sub-insulating layer to 1.1 times to 1.5 times. After this process, the hydrogen content (atomic ratio) in the first sub-insulating layer may be around 30% to 45%.

The first sub-insulating layer may have a uniform hydrogen content. Alternatively, in an exemplary embodiment, the hydrogen content of the first sub-insulating layer decreases in a direction away from the active layer. That is, the first sub-insulating layer has the highest hydrogen content at the interface between the first sub-insulating layer and the first gate insulating layer, and the hydrogen content gradually decreases in a direction away from the active layer. In this way, the ability of the hydrogen atoms to diffuse into the active layer may be improved, and the possibility of the hydrogen in the film layer below the first sub-insulating layer to diffuse into the first sub-insulating layer may be avoided.

Alternatively, the hydrogen content of the first sub-insulating layer may also start to gradually increase from the side far from the active layer in a thickness range of 100 angstroms to 300 angstroms in a direction toward the active layer. In this way, the ability of the hydrogen atoms to diffuse into the active layer may be improved, and the possibility of the hydrogen in the film layer below the first sub-insulating layer to diffuse into the first sub-insulating layer may be avoided.

As used herein, the term "thickness" refers to a dimension in a direction perpendicular to the base substrate.

Figure 4:
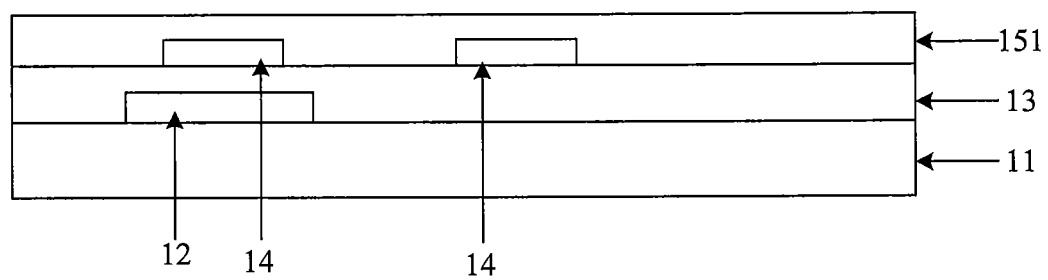
FIG. 4 is a schematic structural diagram of another base substrate in the fabricating method shown in FIG. 2.

When step 202 is completed, the structure of the base substrate may be as shown in FIG. 4, wherein the first sub-insulating layer 151 is formed on the base substrate 11 on which the first gate 14 is formed. The meanings of other reference numerals in FIG. 4 may refer to FIG. 3, and details are not described herein again.

At step 203, a second sub-insulating layer is deposited and formed at a second deposition rate, wherein the second deposition rate is less than the first deposition rate.

By reducing the deposition rate of the second sub-insulating layer, the density of the second sub-insulating layer may be increased, and the second sub-insulating layer may be made denser than the first sub-insulating layer. In this way, the blocking effect of the second sub-insulating layer on hydrogen may be improved, so that it is difficult for the hydrogen in the film layer below the second sub-insulating layer to diffuse outward through the second sub-insulating layer, and thereby the hydrogenation effect to the active layer can be further improved.

Alternatively, the deposition rate of the second sub-insulating layer may be the same as the deposition rate of the first sub-insulating layer, which is not limited in the embodiment of the present disclosure.

In an exemplary embodiment, the first sub-insulating layer and second sub-insulating layer may each have a uniform hydrogen content, and the hydrogen content of the first sub-insulating layer is larger than the hydrogen content of the second sub-insulating layer. Alternatively, the first sub-insulating layer has a decreasing hydrogen content in a direction away from the active layer, the second sub-insulating layer has a uniform hydrogen content, and the hydrogen content of the second sub-insulating layer is less than the minimum hydrogen content of the first sub-insulating layer, so that the ability of the hydrogen atoms to diffuse into the active layer may be improved, and the possibility of the hydrogen in the film layer below the second sub-insulating layer to diffuse outward through the second sub-insulating layer is avoided. Alternatively, the first sub-insulating layer has a uniform hydrogen content, the second sub-insulating layer has a decreasing hydrogen content in a direction away from the first sub-insulating layer, and the hydrogen content of the first sub-insulating layer is larger than the maximum hydrogen content of the second sub-insulating layer, so that the ability of hydrogen atoms to diffuse to the active layer may be improved, and the possibility of the hydrogen in the film layer below the second sub-insulating layer to diffuse outward through the second sub-insulating layer is avoided. In the above embodiment, the hydrogen content (atomic ratio) in the second sub-insulating layer may be around 15% to 30%.

Optionally, a thickness ratio between the second sub-insulating layer and the first sub-insulating layer may be between 1:0.5 and 1:2.

Figure 5:
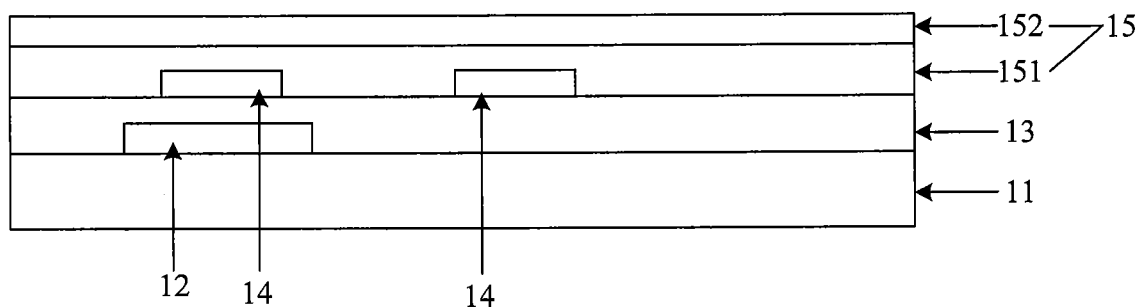
FIG. 5 is a schematic structural diagram of another base substrate in the fabricating method shown in FIG. 2.

When step 203 is completed, the structure of the base substrate may be as shown in FIG. 5, wherein a second sub-insulating layer 152 is formed on the base substrate 11 on which the first sub-insulating layer 151 is formed, and the first sub-insulating layer 151 and the second sub-insulating layer 152 constitutes the second insulating layer 15. The meanings of other reference numerals in FIG. 5 may refer to FIG. 3, and details are not described herein again.

The first sub-insulating layer and the second sub-insulating layer may be different portions (different portions in the thickness direction) of the same film layer formed in one chemical vapor deposition, or two film layers formed separately. When the first sub-insulating layer and the second sub-insulating layer are different portions of the same film layer, compared with the case where the first sub-insulating layer and the second sub-insulating layer are different film layers, the stress between the film layers is reduced, thus the risk of damage to the film layer is reduced.

At step 204, a second gate is formed on the base substrate on which the second gate insulating layer is formed. The second gate may form a capacitor with the first gate to improve the holding capacity of the capacitor in the TFT, thereby enhancing the display effect of the display structure.

Figure 6:
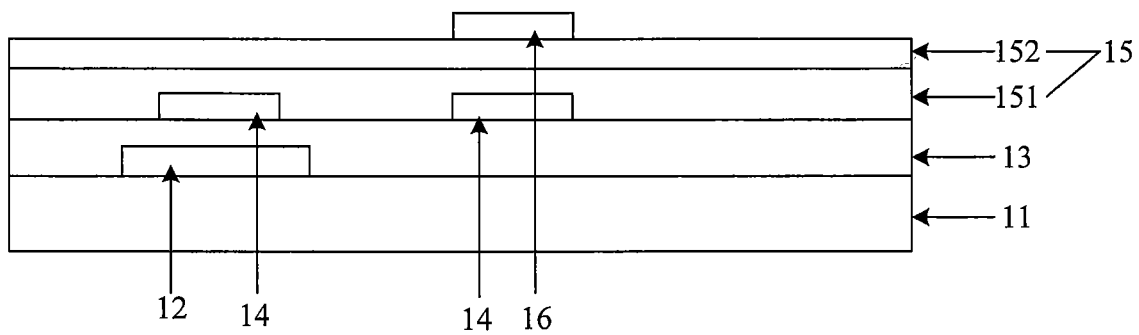
FIG. 6 is a schematic structural diagram of another base substrate in the fabricating method shown in FIG. 2.

When step 204 is completed, the structure of the base substrate may be as shown in FIG. 6, wherein a second gate 16 is formed on the base substrate 11 on which the second gate insulating layer 15 is formed. The meanings of other reference numerals in FIG. 6 may refer to FIG. 3, and details are not described herein again.

After the second gate is formed, the active layer may be subjected to an activation process by heating the base substrate on which each film layer is formed. During heating, the temperature may be slowly raised, so that the stress variation between the film layers may be carried out relatively slowly, to avoid the problem of film layer cracking caused by the stress mismatch between the various film layers.

At step 205, a source-drain via is formed on the base substrate on which the second gate is formed, so that the active layer is exposed through the source-drain via.

Step 205 may be performed at any stage after step 204 and before step 209, for example, a source-drain via may be formed after the active layer is hydrogenated, or a source-drain via may be formed after the inter-layer dielectric layer is formed. In an exemplary embodiment, a source-drain via is formed before the active layer is hydrogenated, so that the hydrogenation effect on the active layer may be improved to a certain extent.

Figure 7:
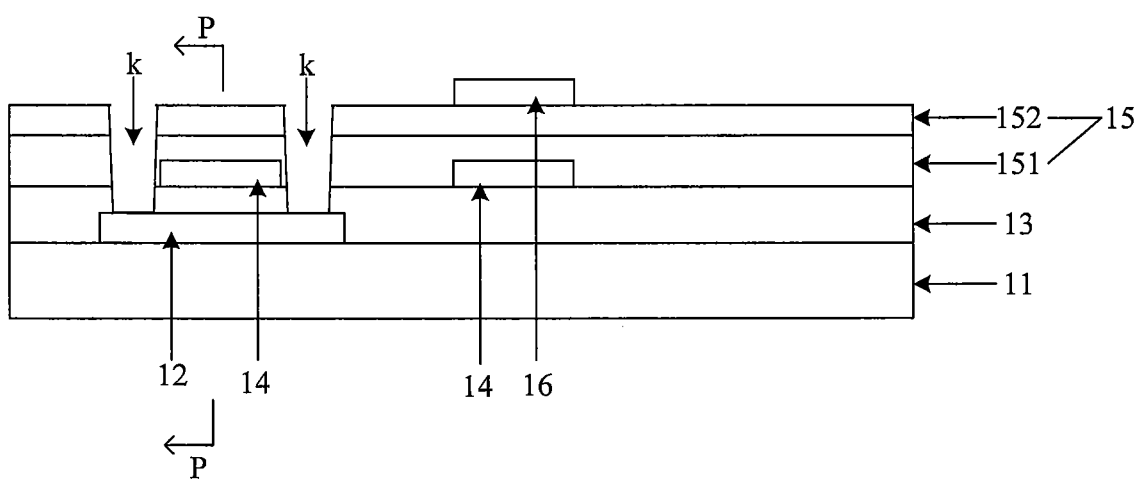
FIG. 7 is a schematic structural diagram of another base substrate in the fabricating method shown in FIG. 2.

When step 205 is completed, the structure of the base substrate may be as shown in FIG. 7, where the active layer 12 is exposed through the source-drain via k, so the subsequently formed source and drain may contact the active layer through the via k. The meanings of other reference numerals in FIG. 7 may refer to FIG. 3, and details are not described herein again.

At step 206, a groove is formed on the base substrate on which the second gate insulating layer is formed, the bottom of the groove is in the first gate insulating layer, and the orthographic projection of the groove on the base substrate is around the active layer. The groove is used to improve the hydrogenation effect on the active layer, and the area of the orthographic projection of the groove on the base substrate is no larger than the area of the orthographic projection of the source-drain via on the base substrate.

Figure 8:
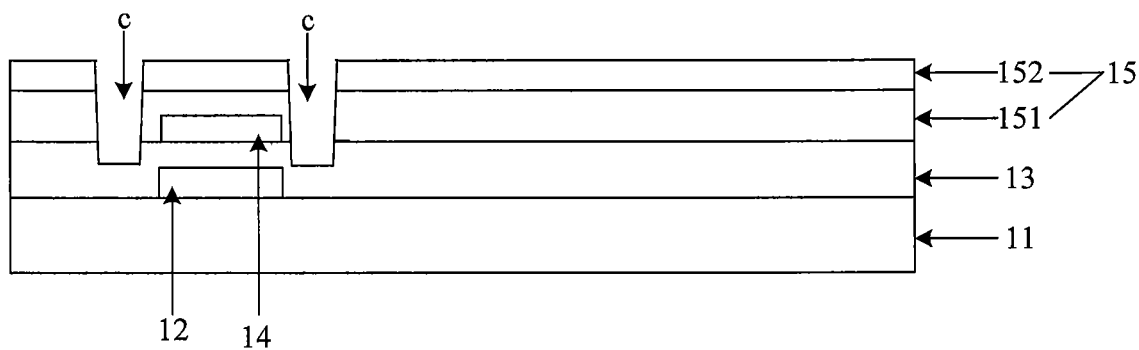
FIG. 8 is a cross-sectional view of the base substrate shown in FIG. 7.

When step 206 is completed, the structure of the base substrate may be as shown in FIG. 8 which shows a cross-sectional view of the base substrate shown in FIG. 7 at P-P. The groove c penetrates through the second insulating layer 15, and the bottom of the groove c is in the first insulating layer 13, and the orthographic projection of the groove c on the base substrate 11 is around the active layer 12. The meanings of other reference numerals in FIG. 8 may refer to FIG. 3, and details are not described herein again.

At step 207, the base substrate on which the groove is formed is placed in a hydrogen atmosphere to hydrogenate the active layer.

After the base substrate on which the groove is formed is disposed in a hydrogen atmosphere, since the hydrogen concentration in the external environment is higher, it is difficult for hydrogen in each film layer on the base substrate to overflow into the external environment, and the hydrogen concentration may form a trend of gradual decrease along the direction from the external environment to the active layer, thereby facilitating the movement of hydrogen into the active layer. In addition, as shown in FIG. 8, in the hydrogen atmosphere, the hydrogen will fill the groove c, which makes the high-concentration hydrogen closer to the active layer 12, thereby further facilitating the movement of hydrogen into the active layer.

Optionally, the hydrogen atmosphere may include only hydrogen, and may also include hydrogen and nitrogen, wherein a partial pressure of hydrogen is no less than 200 mTorr.

At step 208, an inter-layer dielectric layer is formed on the base substrate on which the groove is formed. The inter-layer dielectric layer may be composed of an organic insulating material. In specific implementation, an organic insulating material layer may be firstly formed on a base substrate on which a groove is formed, and then the organic insulating material layer may be patterned into an inter-layer dielectric layer through a patterning process. If the source-drain via have been formed before the inter-layer dielectric layer is formed, the organic insulating material in the source-drain via needs to be etched away to expose the active layer in the source-drain via. In addition, if a groove is formed in the film layer of the base substrate, the groove may be filled with an organic insulating material layer, to improve the flatness of each film layer on the base substrate.

In particular, the inter-layer dielectric layer may be composed of a photoresist material. In specific implementation, a photoresist material layer may be firstly formed on the base substrate on which the groove is formed, for example, with a thickness between 0.2 μm and 0.3 μm, and then an inter-layer dielectric layer is formed by an exposure process and a development process. If the source-drain via have been formed before the inter-layer dielectric layer is formed, the photoresist material in the source-drain via needs to be exposed and developed to remove the photoresist material in the source-drain via, so that the active layer in the source-drain via is exposed. In addition, if a groove is formed on the film layer of the base substrate, the groove may be filled with the photoresist material, and the photoresist material in the groove may be retained after exposure and development, to improve the flatness of each film layer on the base substrate.

Figure 9:
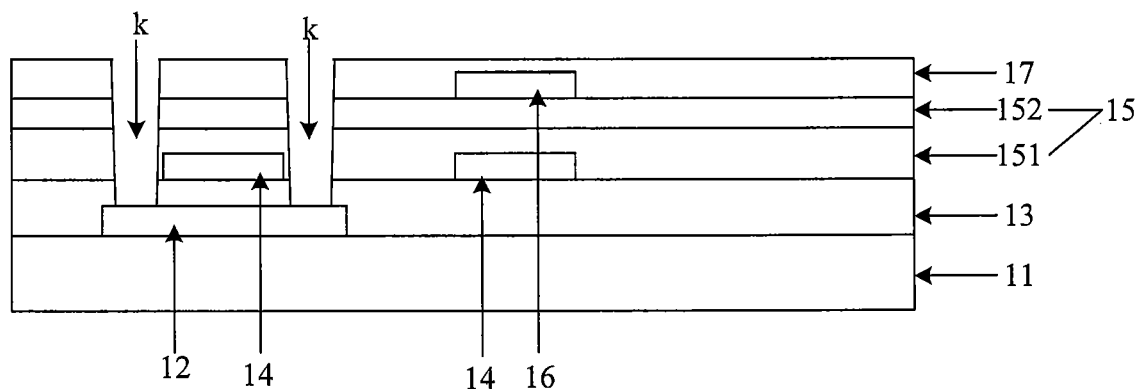
FIG. 9 is a schematic structural diagram of another base substrate in the fabricating method shown in FIG. 2.

When step 208 is completed, the structure of the base substrate may be as shown in FIG. 9, wherein the inter-layer dielectric layer 17 is formed on the base substrate on which the second gate 16 is formed, and the source-drain via k also penetrates through the inter-layer dielectric layer 17.

At step 209, a source and a drain are formed on the base substrate on which the inter-layer dielectric layer is formed.

Figure 10:
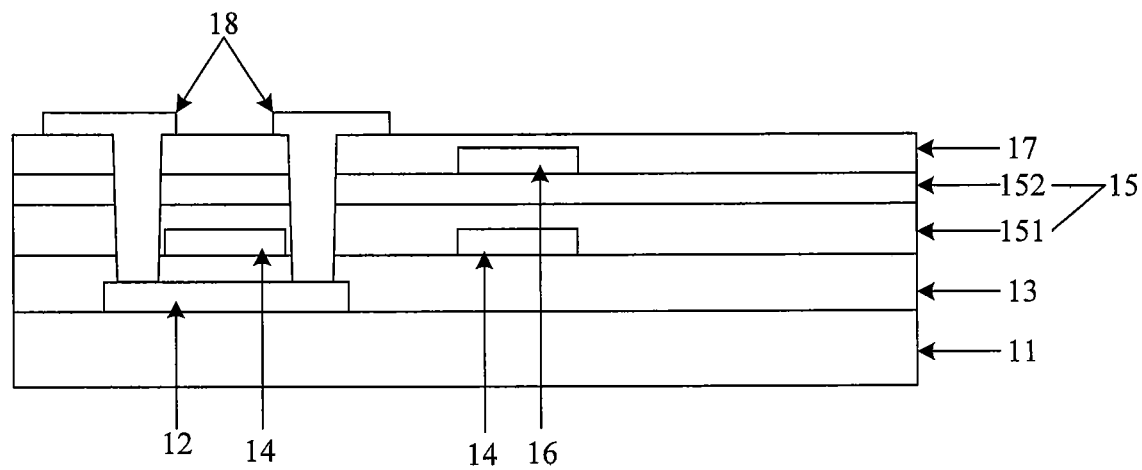
FIG. 10 is a schematic structural diagram of an array substrate in the fabricating method shown in FIG. 2.

When step 209 is completed, the structure of the base substrate may be as shown in FIG. 10, wherein the source and drain 18 are in contact with the active layer 12 through source-drain via.

In summary, in the method for fabricating the array substrate provided by the embodiment of the present disclosure, by forming a first sub-insulating layer with a larger hydrogen content and a second sub-insulating layer with a smaller hydrogen content, during the hydrogenation treatment of the active layer, the first sub-insulating layer acts as a hydrogen source, and the second sub-insulating layer acts as a hydrogen barrier layer, so that hydrogen may diffuse to the direction of the active layer better, thereby increasing the distribution of hydrogen concentration gradient toward the active layer to improve the hydrogenation of the active layer. In this way, insufficient hydrogenation of the active layer may be avoided, which in turn causes problems that affect the electrical performance of the active layer, and the electrical performance of the active layer can be improved.

Figure 11:
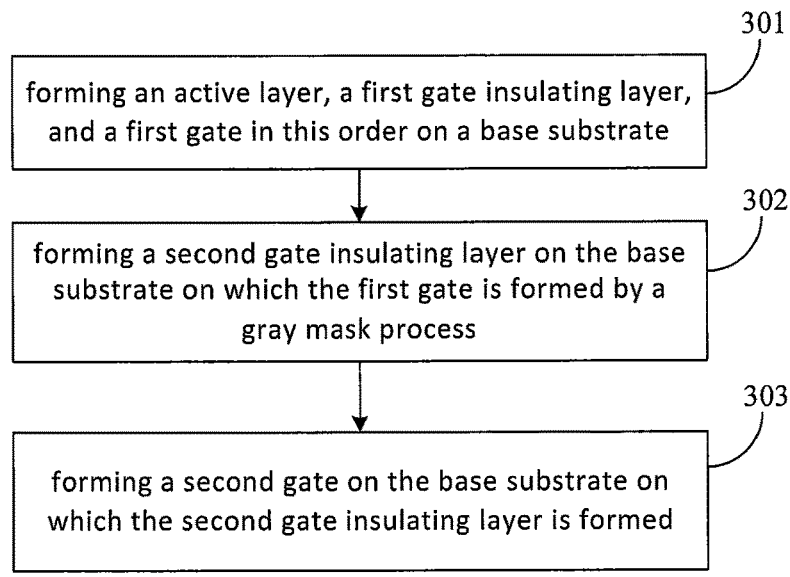
FIG. 11 is a flowchart of another method for fabricating an array substrate according to an embodiment of the present disclosure.

FIG. 11 is a flowchart of another method for fabricating an array substrate according to an embodiment of the present disclosure.

As shown in FIG. 11, at step 301, an active layer, a first gate insulating layer, and a first gate are formed in this order on a base substrate, where the active layer may include LTPS.

For this step, reference may be made to step 201 in the foregoing embodiment, and details are not described herein again.

At step 302, a second gate insulating layer is formed on the base substrate on which the first gate is formed by a gray mask process. In particular, the second gate insulating layer includes a first region and a second region. The thickness of the first region is larger than the thickness of the second region. The active layer is in the orthographic projection of the first region on the base substrate (the distance between the edge of the orthographic projection and the nearest edge of the active layer may be between 1 micrometer and 5 micrometers), and the second region is a region in the second gate insulating layer other than the first region. Because the insulating layer in the first region directly above the active layer is thicker, it may provide more hydrogen in the subsequent hydrogenation process, which is beneficial to the hydrogenation of the active layer. Exemplarily, the thickness of the first region may be 1.1 to 1.3 times the thickness of the second region.

Optionally, the second gate insulating layer is further provided with a trench between each sub-pixel in the array substrate. The trench may reduce continuous abrasion stress and avoid damage to the film layer. The thickness of the second insulating layer at the trench may be, for example, 0.1 to 0.5 times the thickness of the second region. In addition, a trench may also be provided at a wiring position of the second gate between the sub-pixels.

As used herein, a gray mask process is a process of exposing through a gray mask, and a gray mask is a mask that may have different light transmittance in different regions. By using such a mask, patterns with different thicknesses in different regions may be formed. In step 302, a second gate insulating layer having different thicknesses in different regions may be formed by a gray mask process.

Optionally, for the structure of the second gate insulating layer formed by the gray mask process in the embodiment of the present disclosure, reference may also be made to step 202 and step 203 in the above embodiment. That is to say, the second insulating layer may include a first sub-insulating layer with a higher hydrogen content and a second sub-insulating layer with a lower hydrogen content arranged in this order in a direction away from the active layer, in order to further improve the hydrogenation effect on the active layer.

Figure 12:
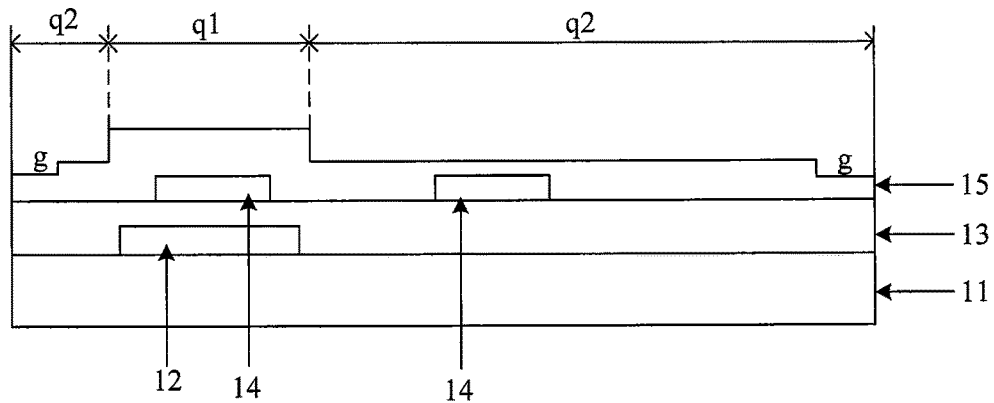
FIG. 12 is a schematic structural diagram of a base substrate in the fabricating method shown in FIG. 11.

When step 302 is completed, the structure of the base substrate may be as shown in FIG. 12, wherein a thickness of the first region q1 is larger than a thickness of the second region q2, and a trench g is provided between a sub-pixel and another sub-pixel.

At step 303, a second gate is formed on the base substrate on which the second gate insulating layer is formed. For this step, reference may be made to step 204 in the foregoing embodiment, and details are not described herein again. After the second gate is formed, since the insulating layer in the second region is thin, a larger capacitance may be formed between the second gate and the first gate at the second region, thereby improving the electrical performance of the TFT.

Figure 13:
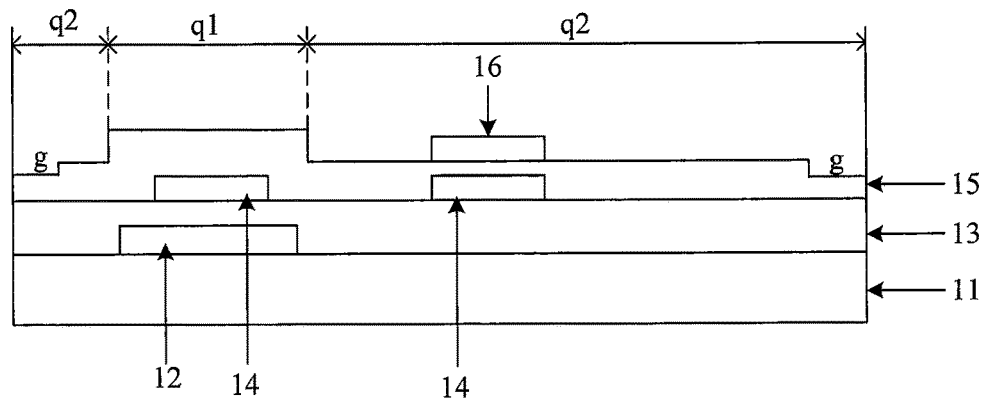
FIG. 13 is a schematic structural diagram of another base substrate in the fabricating method shown in FIG. 11.

When step 303 is completed, the structure of the base substrate may be as shown in FIG. 13, wherein the second insulating layer 15 between the first gate 14 and the second gate 16 is thin, so a larger capacitance may be formed between the first gate 14 and the first gate 16.

Figure 14:
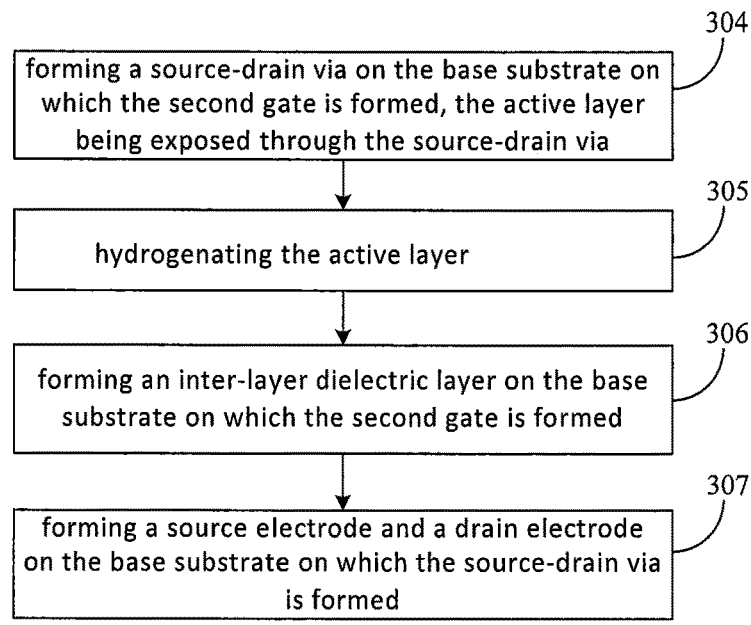
FIG. 14 is a flowchart of a subsequent fabricating process in the fabricating method shown in FIG. 11.

Thereafter, as shown in FIG. 14, at step 304, a source-drain via is formed on the base substrate on which the second gate is formed, so that the active layer is exposed through the source-drain via. For the structure of the source-drain via, reference may be made to the source-drain via k in FIG. 7, and details are not described herein again.

Then, at step 305, the active layer is hydrogenated. For this step, reference may be made to step 207 in the foregoing embodiment, and details are not described herein again.

In addition, in the embodiment of the present disclosure, before the active layer is hydrogenated, the groove c as shown in FIG. 8 may also be formed on each film layer on the base substrate. For this process, reference may be made to step 206 in the foregoing embodiment, and details are not described herein again.

At step 306, an inter-layer dielectric layer is formed on the base substrate on which the second gate is formed. For this step, reference may be made to step 208 in the foregoing embodiment, and details are not described herein again.

Finally, at step 307, a source and a drain are formed on the base substrate on which the source-drain via is formed. For this step, reference may be made to step 209 in the foregoing embodiment, and details are not described herein again.

Figure 15:
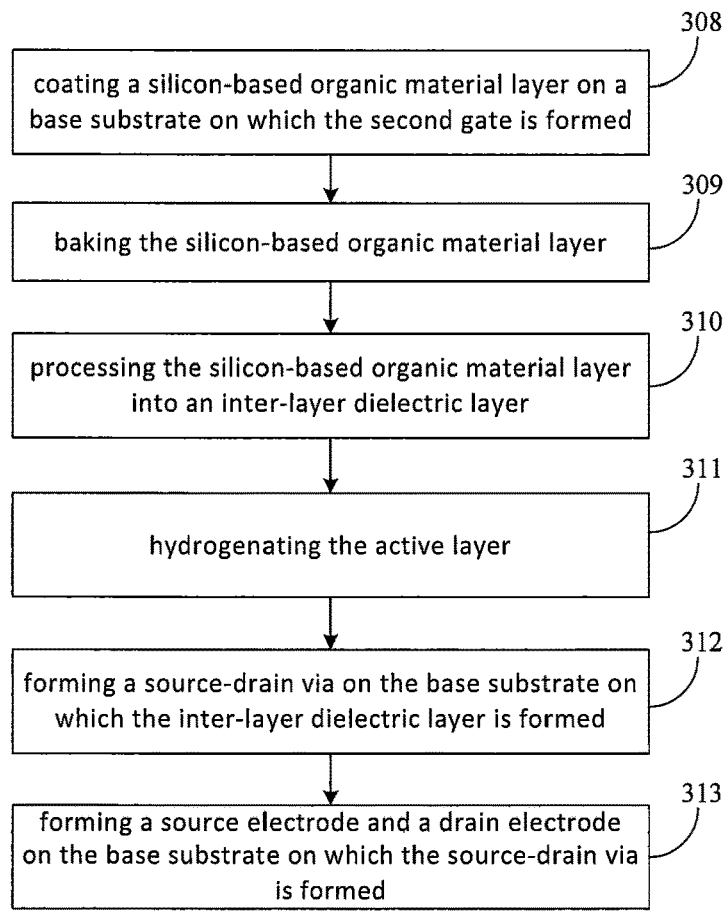
FIG. 15 is a flowchart of another subsequent fabricating process in the fabricating method shown in FIG. 11.

In an alternative embodiment, after step 303 is completed, as shown in FIG. 15, subsequent steps different from FIG. 14 may be performed.

At step 308, a silicon-based organic material layer is coated on the base substrate on which the second gate is formed.

The silicon-based organic material is an organic material with a strong tolerance to temperature, so the silicon-based organic material layer may be coated before the hydrogenation treatment in order to maintain reliability during the subsequent temperature rise process.

Next, in step 309, the silicon-based organic material layer is baked. Baking is able to remove the moisture and some other solvents mixed in the silicon-based organic material, increase the density of the silicon-based organic material layer, and further improve the silicon-based organic material layer's ability to block hydrogen. In addition, the active layer may be activated while baking the silicon-based organic material layer.

Then, at step 310, the silicon-based organic material layer is processed into an inter-layer dielectric layer.

The inter-layer dielectric layer may be formed in different ways. For this step, reference may be made to step 208 in the foregoing embodiment, and details are not described herein again.

At step 311, the active layer is hydrogenated. During the hydrogenation process, an inter-layer dielectric layer composed of a silicon-based organic material may be used to prevent hydrogen of each film layer on the base substrate from overflowing to the outside, so as to improve the hydrogenation effect on the active layer. For this step, reference may be made to step 207 in the foregoing embodiment, and details are not described herein again.

Next, at step 312, a source-drain via is formed on the base substrate on which the inter-layer dielectric layer is formed. Of course, step 312 may also be performed before step 311, that is, source-drain via may be formed before the hydrogenation treatment, which is not limited in the embodiment of the present disclosure.

At step 313, a source and a drain are formed on the base substrate on which the source-drain via is formed. For this step, reference may be made to step 209 in the foregoing embodiment, and details are not described herein again.

Figure 16:
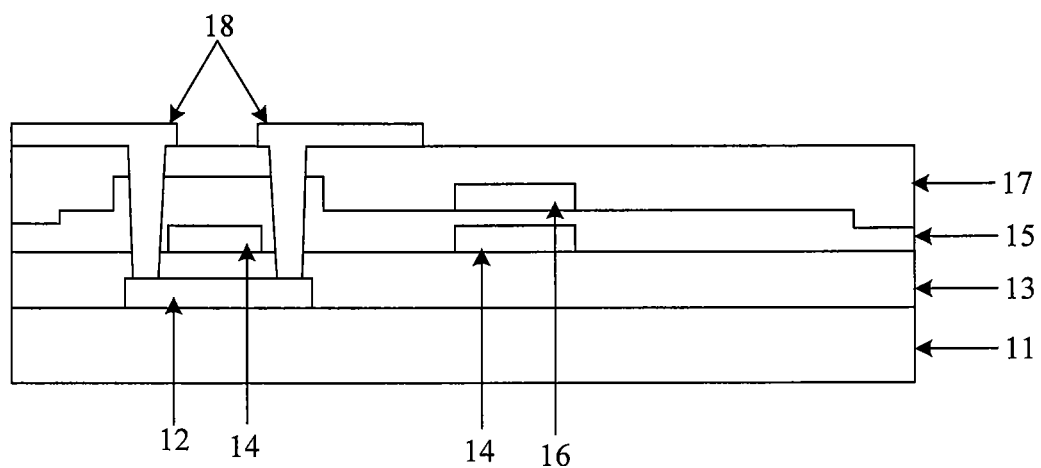
FIG. 16 is a schematic structural diagram of an array substrate in the fabricating method shown in FIG. 11.

When step 313 is completed, the structure of the base substrate may be as shown in FIG. 16, wherein the inter-layer dielectric layer 17 is formed on the base substrate on which the second gate 16 is formed, and the source and drain 18 are formed on the base substrate on which the inter-layer dielectric layer 17 is formed, and the source and drain 18 contact the active layer 12 through the source-drain via.

In summary, in the above method for fabricating the array substrate provided by the embodiment of the present disclosure, by forming a first sub-insulating layer with a larger hydrogen content and a second sub-insulating layer with a smaller hydrogen content, during the hydrogenation treatment of the active layer, the first sub-insulating layer acts as a hydrogen source, and the second sub-insulating layer acts as a barrier layer, so that hydrogen may diffuse to the direction of the active layer better, thereby increasing the distribution of hydrogen concentration gradient toward the active layer to improve the hydrogenation of the active layer. In this way, insufficient hydrogenation of the active layer may be avoided, which in turn causes problems that affect the electrical performance of the active layer, and the electrical performance of the active layer may be improved.

An embodiment of the present disclosure further provides an array substrate. The array substrate is an array substrate fabricated by any of the methods described above, such as the array substrate shown in FIG. 10 or the array substrate shown in FIG. 16.

As shown in FIGS. 10 and 16, the array substrate includes: a base substrate 11; an active layer 12 on the base substrate 11; a first gate insulating layer 13 on the active layer 12; a first gate 14 on the first gate insulating layer 13, and a second gate insulating layer 15 on the first gate 14. The second gate insulating layer 15 includes a first sub-insulating layer 151 and a second sub-insulating layer 152 disposed in a direction away from the active layer 12, and the hydrogen content of the first sub-insulating layer 151 is larger than that of the second sub-insulating layer 152.

For other exemplary embodiments of the above-mentioned array substrate, reference may be made to the description of the above-mentioned fabricating methods of the array substrate, and details are not described herein again.

An embodiment of the present disclosure further provides a display panel including any of the above-mentioned array substrates. The display panel may be an Organic Light-Emitting Diode (OLED) display panel or a liquid crystal display panel.

It should be noted that in the drawings, the dimensions of layers and areas may be exaggerated for clarity. It is also understood that when an element or layer is referred to as "on" another element or layer, it may be directly on the other element or there may be an intermediate layer. In addition, it may be understood that when an element or layer is referred to as "under" another element or layer, it may be directly under the other element, or there may be more than one intermediate layer or element. In addition, it may be further understood that when a layer or element is referred to as "between" two layers or two elements, it may be the only layer between the two layers or two elements, or there may be more than one intermediate layer or element. Like reference numerals indicate like elements throughout.

Further, herein, although the embodiments of the method are described in a certain order, the order of the description does not constitute a limitation on the execution order of the embodiments of the method. Those skilled in the art may adaptively adjust the execution order of each step of the method in view of the teachings in this disclosure.

In this disclosure, the terms "first" and "second" are used for descriptive purposes only and are not to be construed to indicate or imply relative importance. The term "plurality" refers to two or more, unless explicitly defined otherwise.

A person of ordinary skill in the art may understand that all or part of the steps of implementing the foregoing embodiments may be implemented by hardware, or by instructing a relevant hardware to accomplish this by a program. The program may be stored in a computer-readable storage medium. The storage medium mentioned may be a read-only memory, a magnetic disk or an optical disk, etc.

The above are merely exemplary embodiments of the present disclosure, and are not intended to limit the present disclosure. Any modification, equivalent replacement, improvement, etc. made within the spirit and principles of the present disclosure shall be included in the protection range of the present disclosure.

The invention claimed is:

1. An array substrate comprising: a base substrate; an active layer on the base substrate; a first gate insulating layer on the active layer; a first gate on the first gate insulating layer; and a second gate insulating layer on the first gate, wherein the second gate insulating layer comprises a first sub-insulating layer and a second sub-insulating layer in a direction away from the active layer, wherein a hydrogen content of the first sub-insulating layer is greater than a hydrogen content of the second sub-insulating layer, wherein the hydrogen content of the second sub-insulating layer decreases in the direction away from the active layer, and wherein the hydrogen content of the first sub-insulating layer at a surface facing the second sub-insulating layer is greater than a hydrogen content of the second sub-insulating layer at a surface facing the first sub-insulating layer.

2. The array substrate according to claim 1, wherein a density of the first sub-insulating layer is less than a density of the second sub-insulating layer.

3. The array substrate according to claim 1, wherein a hydrogen content of the first sub-insulating layer decreases in the direction away from the active layer, and wherein a hydrogen content of the first sub-insulating layer at a surface facing the second sub-insulating layer is greater than a hydrogen content of the second sub-insulating layer at a surface facing the first sub-insulating layer.

4. The array substrate according to claim 1, wherein a hydrogen content of at least one of the first sub-insulating layer and the second sub-insulating layer is constant in the direction away from the active layer.

5. The array substrate according to claim 1, wherein the hydrogen content of the first sub-insulating layer is between 30% to 45%.

6. The array substrate according to claim 1, further comprising:
a groove penetrating through the second gate insulating layer and extending into the first gate insulating layer, wherein an orthographic projection of the groove on the base substrate is around an orthographic projection of the active layer on the base substrate.

7. The array substrate according to claim 1,
wherein the second gate insulating layer comprises a first region and a second region,
wherein a thickness of the first region is greater than a thickness of the second region,
wherein the active layer is in an orthographic projection of the first region on the base substrate, and
wherein the second region is a region of the second gate insulating layer other than the first region.

8. The array substrate according to claim 1, further comprising:
a second gate on the second gate insulating layer; and
a source-drain via penetrating through the second gate insulating layer and the first gate insulating layer,
wherein the active layer is exposed through the source-drain via.

9. The array substrate according to claim 8, further comprising:
an inter-layer dielectric layer on the second gate.

10. The array substrate according to claim 1,
wherein the array substrate comprises a plurality of sub-pixels arranged in a matrix, and
wherein the second gate insulating layer further comprises a trench between each of the sub-pixels.

11. A display panel comprising the array substrate according to claim 1.

12. A method for fabricating an array substrate, comprising: forming an active layer, a first gate insulating layer, and a first gate in order on a base substrate; forming a second gate insulating layer on the base substrate on which the first gate is formed, the second gate insulating layer comprising a first sub-insulating layer and a second sub-insulating layer disposed in a direction away from the active layer, wherein a hydrogen content of the first sub-insulating layer is greater than a hydrogen content of the second sub-insulating layer; and hydrogenating the active layer, wherein the hydrogen content of the second sub-insulating layer decreases in the direction away from the active layer, and wherein the hydrogen content of the first sub-insulating layer at a surface facing the second sub-insulating layer is greater than a hydrogen content of the second sub-insulating layer at a surface facing the first sub-insulating layer.

13. The method according to claim 12, wherein said forming the second gate insulating layer on the base substrate on which the first gate is formed, comprises:
depositing and forming the first sub-insulating layer on the base substrate on which the first gate is formed at a first deposition rate; and
depositing and forming the second sub-insulating layer on the base substrate on which the first sub-insulating layer is formed at a second deposition rate,
wherein the second deposition rate is less than the first deposition rate.

14. The method according to claim 12, wherein before hydrogenating the active layer, the method further comprises: forming a second gate on the base substrate on which the second gate insulating layer is formed; and forming a source-drain via on the base substrate on which the second gate is formed, wherein the active layer is exposed through the source-drain via.

15. The method according to claim 12, wherein before hydrogenating the active layer, the method further comprises:
forming a groove on the base substrate on which the second gate insulating layer is formed, wherein a bottom of the groove is in the first gate insulating layer, and an orthographic projection of the groove on the base substrate is around an orthographic projection of the active layer on the base substrate, and
wherein the hydrogenating the active layer comprises:
disposing the base substrate on which the groove is formed in a hydrogen atmosphere, to hydrogenate the active layer.

16. The method according to claim 12, wherein before hydrogenating the active layer, the method further comprises:
forming a second gate on the base substrate on which the second gate insulating layer is formed;
coating a silicon-based organic material layer on the base substrate on which the second gate is formed;
baking the silicon-based organic material layer; and
processing the silicon-based organic material layer into an inter-layer dielectric layer.

17. The method according to claim 12, wherein said forming the second gate insulating layer on the base substrate on which the first gate is formed, comprises:
- forming the second gate insulating layer on the base substrate on which the first gate is formed by a gray mask process,
- wherein the second gate insulating layer comprises a first region and a second region,
- wherein a thickness of the first region is greater than a thickness of the second region,
- wherein the active layer is in an orthographic projection of the first region on the base substrate, and
- wherein the second region is a region of the second gate insulating layer other than the first region.

18. The method according to claim 12, wherein the array substrate comprises a plurality of sub-pixels arranged in a matrix, and wherein the method further comprises:
- forming a trench between each of the sub-pixels in the second gate insulating layer.

19. The method of claim 12, wherein the active layer comprises one or more of low temperature polysilicon or microcrystalline silicon.

\* \* \* \* \*